United States Patent [19]

Numata et al.

[11] Patent Number: 4,716,359
[45] Date of Patent: Dec. 29, 1987

[54] OUTPUT STAGE CONTROL CIRCUIT

[75] Inventors: Hidetaka Numata; Toshihiko Kawata, both of Furukawa, Japan

[73] Assignee: Alps Electric Co., Ltd., Japan

[21] Appl. No.: 930,794

[22] Filed: Nov. 13, 1986

[30] Foreign Application Priority Data

Nov. 15, 1985 [JP] Japan .................................. 60-257475

[51] Int. Cl.$^4$ ............................................. G05F 1/445
[52] U.S. Cl. ..................................... 323/349; 323/274; 323/281
[58] Field of Search ....................... 323/267, 274–276, 323/279, 281, 349, 350, 222

[56] References Cited

U.S. PATENT DOCUMENTS

| | | | |
|---|---|---|---|
| 3,519,839 | 7/1970 | Nehez | 323/349 X |
| 3,978,391 | 8/1976 | Migeon et al. | 323/281 |
| 4,323,839 | 4/1982 | Imazeki et al. | 323/267 |

*Primary Examiner*—Peter S. Wong
*Attorney, Agent, or Firm*—Guy W. Shoup

[57] ABSTRACT

An output stage control circuit comprises an output driving means connected to a load for driving the same, a control means for taking out detection signals corresponding to signals flowing to the load and supplying analog control signals to the output driving means and a reference signal supply means for supplying reference signals to the control means, in which the analog control signals are generated depending on the detection signals and the reference signal, and the load is driven in an analogous manner by the output driving means depending on the analog control signals. The output stage control circuit can continuously supply the current to the load thereby operating the load stably with less occurrence of noises and stably for a long period of time.

3 Claims, 5 Drawing Figures

OUTPUT STAGE CONTROL CIRCUIT

BACKGROUND OF THE INVENTION

1. Field of the Invention

This invention concerns an output stage control circuit.

2. Description of the Prior Art

Various equipments, for instance, driving motors, illumination equipments, warming units, etc mounted on a vehicle are driven by car batteries. They constitute the battery load and have to be controlled variably depending on the change of the situations, etc.

For satisfying such demands, there has been known an output stage control circuit as shown in FIG. 3, in which a load 21 is a motor, lamp, heater or the like and driven by a transistor 23 at the output stage connected in series therewith.

A constant voltage source 25 producing a constant voltage V is disposed between a DC voltage (+Vcc) supplied from the battery and the ground, and a variable resistor 27 and a resistor 29 is connected in series with the constant voltage source 25, the resistor 29 being grounded.

A control circuit 30 for controlling the output stage transistor 23 comprises a comparator 31, a resistor 33 and a capacitor 35. The comparator 31 is connected at the inverted input terminal thereof to a common junction point 41 between the variable resistor 27 and the resistor 29. Further, the non-inverted input terminal of the comparator is grounded to the earth by way of a capacitor 35 on one hand and connected also to a common junction point 43 between the load 21 and the output stage transistor 23 by way of a resistor 33 on the other hand.

In the output stage control circuit of such a constitution, a reference voltage Vr is set to the comparator 31 as shown in FIG. 4 and the comparator compares to judge a higher level Vh of an input voltage Vin (Vin>Vr) and a lower level V1 of the input voltage Vin (Vin<Vr) relative to the reference voltage Vr. Then, when the reference voltage Vr is set to a higher value and if the input voltage Vin is higher than V1, a voltage at "H" level is outputted from the comparator 31 to render the output stage transistor 23 conductive. Accordingly, a current $i_o$ is supplied to the load 21. When the current $i_o$ flows, the input voltage Vin is lowered for a time T1 determined by the ratio Vh−V1 (=1 mV)/Vh. While on the other hand, when the input voltage Vin is lowered to the V1 level, since the output of the comparator 31 turns to the "L" level, the output stage transistor 23 is switched to the OFF state to interrupt the supply of the current $i_o$ to the load 21. Accordingly, the current $i_o$ is supplied intermittently for a period of time T1.

Further, also in the case of setting the reference voltage Vr to a lower value, the comparator 31 repeats the identical operation. In this case, since the comparison level V'h (<Vh) and V'1 (<V1) are entirely lowered, the output period for the voltage at "H" level of the comparator 31 changes to T2.

As has been described above, the current $i_o$ is supplied intermittently to the load 21 in the conventional output stage control circuit using the comparator 31. However, in the case of intermittently supplying the current $i_o$ to the load 21, if a motor is connected as the load, the output operation such as rotating torque of the motor becomes instable and the motor often generates noises.

In addition, since starting or flickering is repeated if the motor or the lamp is connected as the load 21, the working life is shortened.

SUMMARY OF THE INVENTION

The object of this invention is to provide an output stage control circuit capable of stably supplying a current to a load.

The foregoing object of this invention can be attained by an output stage control circuit comprising an output driving means connected to a load for driving the same, a control means for taking out detection signals corresponding to signals flowing to the load and supplying analog control signals to the output driving means and a reference signal supplying means for supplying reference signals to the control means, in which the analog control signals are generated depending on the detection signals and the reference signal, and the load is driven in an analogous manner by the output driving means depending on the analog control signals.

BRIEF DESCRIPTION OF THE ACCOMPANYING DRAWINGS

These and other object, as well as features of this invention will become apparent by reading the following descriptions by way of preferred embodiments thereof while referring to the accompanying drawings, wherein FIG. 1 is a diagram showing the output stage control circuit of one embodiment according to this invention;

DESCRIPTION OF THE PREFERRED EMBODIMENTS

This invention will now be described in more detail by way of its preferred embodiments while referring to the accompanying drawings.

Figure 1:
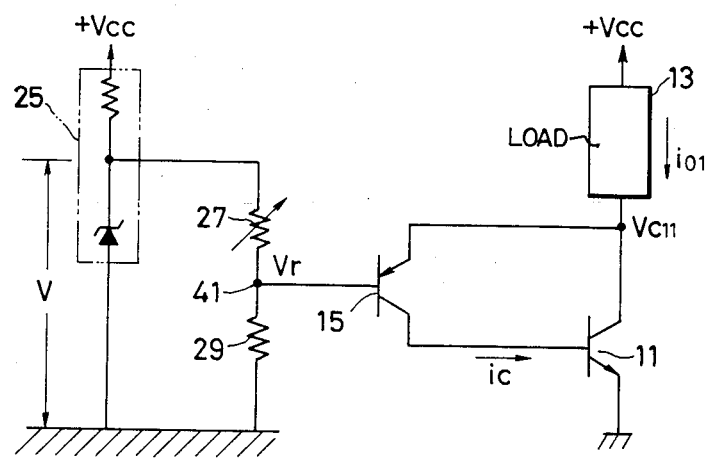

FIG. 1 shows one embodiment according to this invention. In the drawing, an output stage transistor (NPN) 11 is grounded at its emitter and connected at its collector to a driving voltage (+Vcc) source by way of a load 13.

Figure 2:
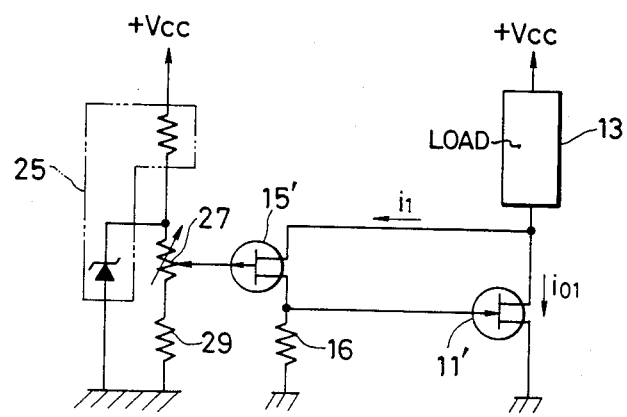
FIG. 2 is a circuit diagram for another embodiment according to this invention.
Figure 3:
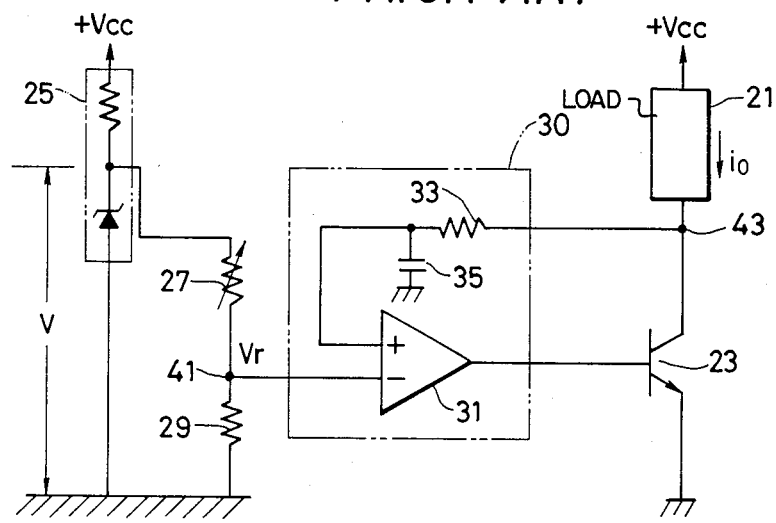
FIG. 3 is a diagram for the conventional output stage control circuit.
Figure 4:
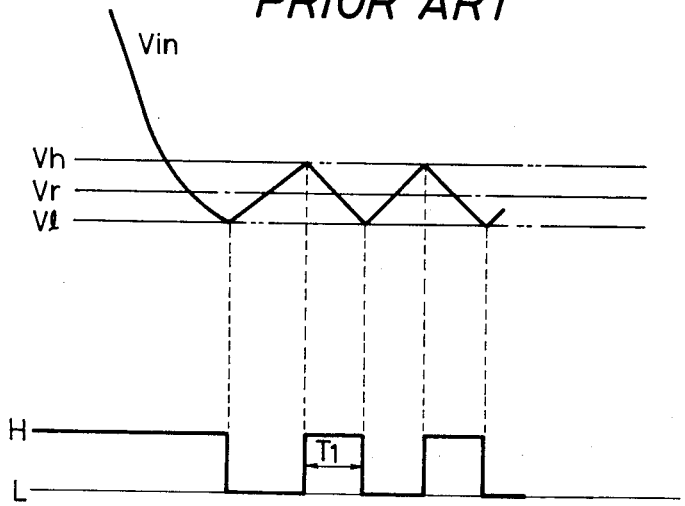
FIGS. 4 and 5 are waveform charts for explaining the operation of the circuit shown in FIG. 4.
Figure 5:
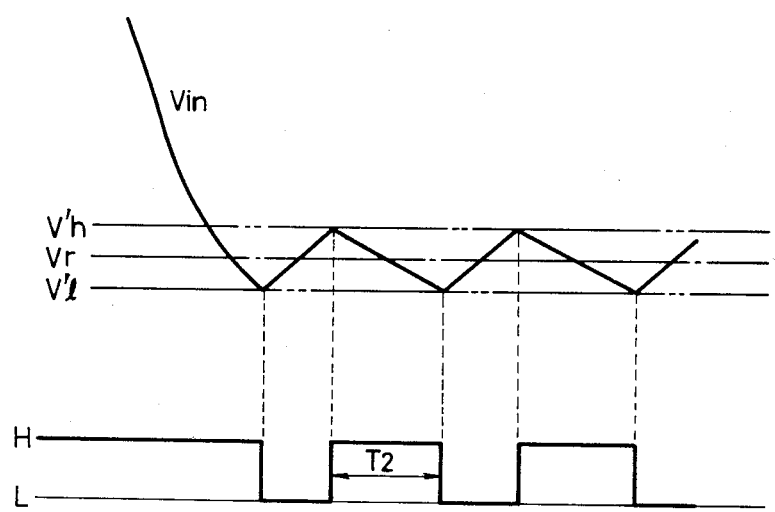

Means for generating a reference voltage Vr is prepared in the same manner as in the case shown in FIG. 2, by connecting a constant voltage source 25, a variable resistor 27 and a resistor 29.

A control transistor (PNP) 15 is connected at its base to a common junction point 41 at which the reference voltage Vr is formed, while connected at its collector and emitter correspondingly to the base and the collector of the output stage transistor 11 respectively.

The operation of the circuit having the foregoing constitution will now be explained below.

When the variable resistor 27 is operated to determine the reference voltage Vr to a predetermined value, the base current for the control transistor 15 is determined unilaterally by the reference voltage Vr. Then, when the base current is thus determined, the control current $i_o$ flowing to the collector of the control transistor 15, that is, the base current for the output stage transistor 11 is determined. Accordingly, when the input voltage Vin increases, since the base current to the control transistor 15 is increased and the control current $i_o$ is also increased, the current $i_o$ flowing to the load 13 is increased and the current $i_o$ flows from the collector to the emitter of the output stage transistor 11. Accordingly, the rise in the input voltage Vin is limited and the input voltage Vin is maintained, for example, at $Vr+0.6$ V.

While on the other hand, when the input voltage Vin is lowered, since the base current of the control transistor 15 is decreased and the control current $i_o$ is also decreased, the current $i_o$ flowing into the output stage transistor 11 is controlled. Accordingly, since the input voltage Vin is increased, the voltage Vin is also maintained in this case at $Vr+0.6$ V.

In this way, the control transistor 15 operates so as to maintain the input voltage Vin to $Vr+0.6$ V and supplies the current $i_o$ continuously to the load 13. Therefore, the load 13 operates stably.

By the way, if the reference voltage Vr is set to the minimum value, the input voltage Vin is determined depending on the collector-emitter voltage Vce1 of the transistor 15 and the base-emitter voltage Vbe2 of the output stage transistor 11. That is, the input voltage Vin is determined depending on the characteristics of the device as: $Vin = Vce1 + Vbe2$.

Although the output stage transistor 11 and the control transistor 15 used in the foregoing embodiment are bipolar transistors but field effect transistors (FET) may also be used instead. That is, as shown in FIG. 2, a junction type control FET 15' is connected at its gate to a variable resistor 27, while connected at its base to the gate of a junction type output stage FET 11'. Accordingly, the current i1 corresponding to the reference voltage Vr flows between the drain and the source of the control FET 15' and, since the current I1 is converted through the resistor 16 into a voltage, the output stage FET 11' can be controlled to continuously supply the current i01 to the load 13.

According to this invention, since a current can continuously be supplied to the load, it is possible to provide an output stage control circuit capable of operating stably with less occurrence of noises and, in addition, operating the load for a long period of time.

What is claimed is:

1. An output stage control circuit for stably controlling a current through a varying load having one terminal connected to a power supply source, comprising:

output driving means constituted by an output stage transistor having its collector and emitter terminals connected in series between the other terminal of said load and ground for adjusting the current through said load;

control means constituted by a control transistor having its collector and emitter terminals connected between said other terminal of said load and a base terminal of said output stage transistor for supplying an analog control signal to said base terminal of said output stage transistor; and a reference voltage supply source for providing a reference voltage signal to a base terminal of said control transistor, whereby the current through the load is stably controlled by said output driving means in response to the analog control signal provided by said control means which is determined in response to the reference voltage signal.

2. An output stage control circuit as defined in claim 1, wherein the output driving means for driving the load is a bipolar transistor and the control means for supplying the analog control signals to said output driving means is a bipolar transistor.

3. An output stage control circuit as defined in claim 1, wherein the output driving means for driving the load is a field effect transistor and the control means for supplying analog control signals to said output driving means is a field effect transistor.

* * * * *